United States Patent
Ando et al.

(10) Patent No.: US 10,915,811 B1
(45) Date of Patent: Feb. 9, 2021

(54) INTERCALATION CELLS FOR MULTI-TASK LEARNING

(71) Applicant: International Business Machines Corporation, Armonk, NY (US)

(72) Inventors: Takashi Ando, Tuckahoe, NY (US); Jianshi Tang, Elmsford, NY (US); Praneet Adusumilli, Somerset, NJ (US); Reinaldo Vega, Mahopac, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/575,380

(22) Filed: Sep. 18, 2019

(51) Int. Cl.
*G06N 3/063* (2006.01)
*H01L 27/24* (2006.01)
*G06N 3/08* (2006.01)

(52) U.S. Cl.
CPC ........... *G06N 3/0635* (2013.01); *G06N 3/084* (2013.01); *H01L 27/2463* (2013.01)

(58) Field of Classification Search
None
See application file for complete search history.

(56) References Cited

U.S. PATENT DOCUMENTS

| | | |
|---|---|---|
| 9,224,946 B2 | 12/2015 | Kim et al. |
| 10,055,434 B2 | 8/2018 | Birdwell et al. |
| 10,140,252 B2 | 11/2018 | Fowers et al. |
| 2016/0005882 A1 | 1/2016 | Kwon |
| 2018/0082177 A1 | 3/2018 | Boybat Kara et al. |
| 2018/0219519 A1* | 8/2018 | Schober ............. H01L 29/4238 |
| 2018/0293487 A1 | 10/2018 | Copel et al. |
| 2018/0300617 A1 | 10/2018 | McBride et al. |
| 2018/0300619 A1 | 10/2018 | Lee |

OTHER PUBLICATIONS

J. Tang et al., "ECRAM as Scalable Synaptic Cell for High-Speed, Low-Power Neuromorphic Computing," 2018 IEEE International Electron Devices Meeting (IEDM), San Francisco, CA, 2018, pp. 13.1.1-13.1.4, doi: 10.1109/IEDM.2018.8614551. (Year: 2019).*
P. Chen et al., "Mitigating effects of non-ideal synaptic device characteristics for on-chip learning," 2015 IEEE/ACM International Conference on Computer-Aided Design (ICCAD), Austin, TX, 2015, pp. 194-199, doi: 10.1109/ICCAD.2015.7372570. (Year: 2015).*
Van de Burgt, Y., Lubberman, E., Fuller, E. et al. A non-volatile organic electrochemical device as a low-voltage artificial synapse for neuromorphic computing. Nature Mater 16, 414-418 (2017). https://doi.org/10.1038/nmat4856. (Year: 2017).*
Goodfellow et al., Deep Learning, MIT Press, 2016—http://www.deeplearningbook.org/ Chapter 7, pp. 224-270—http://www.deeplearningbook.org/contents/regularization.html.

* cited by examiner

*Primary Examiner* — J. E. Schoenholtz
(74) *Attorney, Agent, or Firm* — L. Jeffrey Kelly; Otterstedt, Wallace & Kammer, LLP

(57) ABSTRACT

An electro-chemical random-access memory (ECRAM) cell includes a substrate and a plurality of source-drain pairs positioned on a top surface of the substrate, each source-drain pair comprising a source and a drain. A channel at least partially overlays the substrate and the plurality of source-drain pairs, and a transfer layer at least partially overlays the channel. A gate at least partially overlays the transfer layer, the gate at least partially controlling a channel between each source-drain pair.

20 Claims, 12 Drawing Sheets

INTERCALATION CELLS FOR MULTI-TASK LEARNING

BACKGROUND

The present invention relates to the electrical, electronic and computer arts, and more specifically, to multi-task learning.

Modern instantiations of two-terminal non-volatile memory (NVM) devices are considered as a promising technology for electronic synapse devices and memristors for neuromorphic computing as well as high-density and high-speed non-volatile memory applications. In neuromorphic computing applications, a two-terminal NVM can be used as a connection (synapse) between a pre-neuron and post-neuron, representing the connection weight in the form of device resistance. Multiple pre-neurons and post-neurons can be connected through a crossbar array of NVMs, which naturally expresses a fully-connected neural network. In a conventional crossbar array structure, weights stored at a synapse can be shared with only one pair of pre- and post-neurons, limiting its application to sequential deep neural networks.

A nonvolatile electro-chemical random-access memory (ECRAM) based on lithium (Li) or oxygen (O) ion intercalation in tungsten oxide ($WO_3$) has been recently demonstrated as an artificial synapse for neuromorphic computing. In ECRAM, programming (with the input via a gate of the ECRAM) and sensing (conductance measurement via the source-drain pair of the ECRAM) are separated (unlike two-terminal NVMs such as resistive random access memory (RRAM), phase-change memory (PCM), and the like). This provides additional freedom in circuit design; however, conventional ECRAMs use one pair of source-drain elements for sensing, limiting application in sequential deep neural networks.

SUMMARY

Principles of the invention provide techniques for intercalation cells for multi-task learning. In one aspect, an exemplary an electro-chemical random-access memory (ECRAM) cell comprises a substrate; a plurality of source-drain pairs positioned on a top surface of the substrate, each source-drain pair comprising a source and a drain; a channel at least partially overlaying the substrate and the plurality of source-drain pairs; a transfer layer at least partially overlaying the channel; and a gate at least partially overlaying the transfer layer, the gate at least partially controlling a channel between each source-drain pair.

In one aspect, a multi-task learning system comprises an input layer; a pre-trained shared layer coupled to the input layer; and one or more processing layers coupled to the pre-trained shared layer; wherein the pre-trained shared layer comprises an array of ECRAMs, each ECRAM comprises a gate; and a plurality of source-drain pairs, each source drain-pair comprising a source and a drain and providing a connection to a task of one of the one or more processing layers, the gate at least partially controlling a channel between each source-drain pair.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Certain aspects of the invention or elements thereof (e.g., Electronic design automation (EDA) tools for design of circuitry) can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

an ECRAM cell featuring a gate and multiple source-drain pairs to facilitate the distribution of data;

an ECRAM array facilitating the distribution of shared data from a single ECRAM cell to a plurality of tasks (implemented with individual neural networks) via the multiple source-drain pairs of the ECRAM cell;

techniques for physically sharing weights across multiple tasks, substantially reducing operational delay, power consumption, and footprint penalties; and techniques for improving the generalization of neural networks in multi-task learning (as compared to separately training multiple models).

These and other features and advantages of the present invention will become apparent from the following detailed description of illustrative embodiments thereof, which is to be read in connection with the accompanying drawings.

DETAILED DESCRIPTION

Framework of Multi-Task Learning

Figure 1:
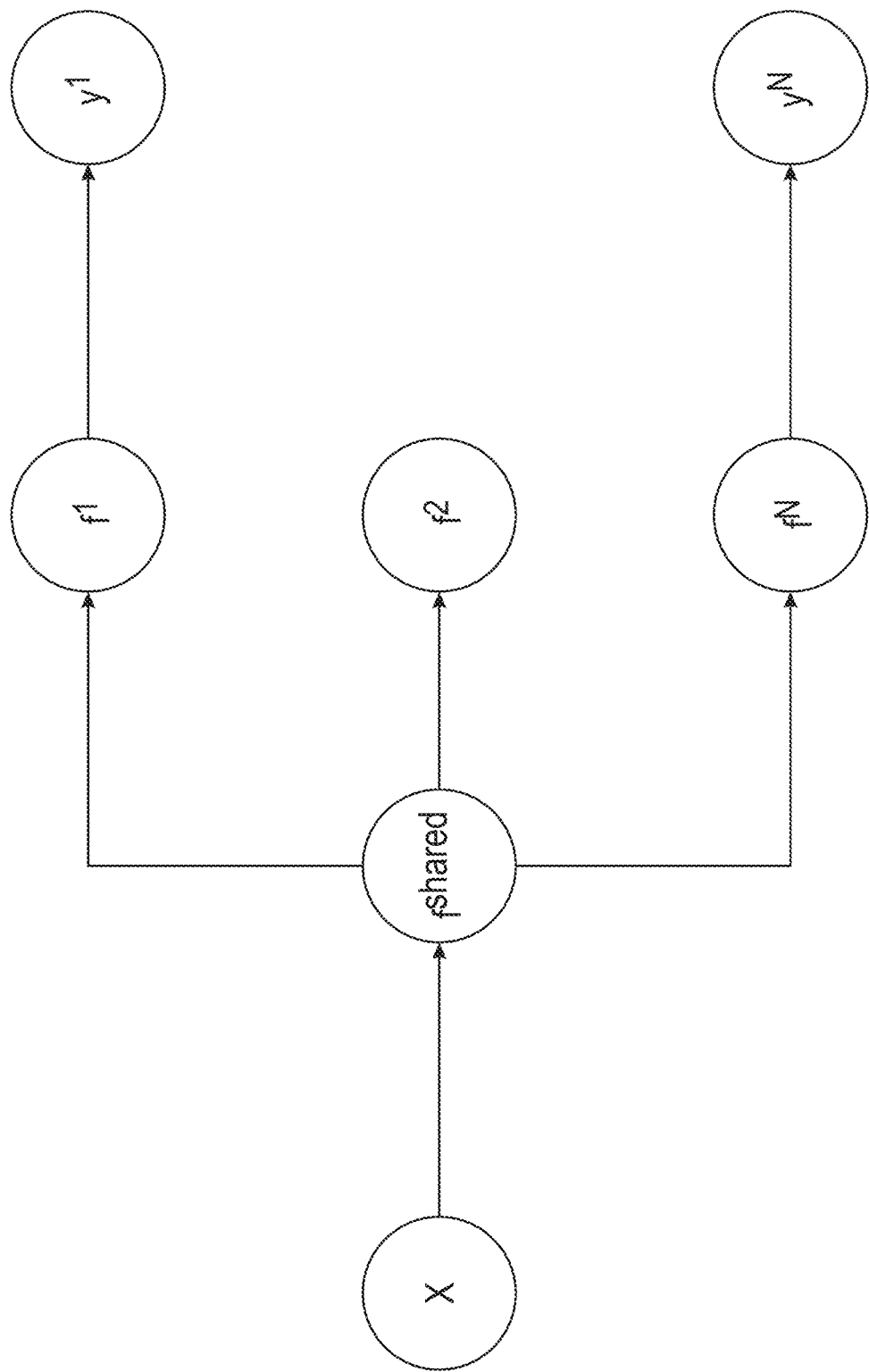
FIG. 1 illustrates a framework for multi-task learning, in accordance with an example embodiment.

FIG. 1 illustrates a framework for multi-task learning, in accordance with an example embodiment. In general, the framework includes task-specific parameters and general parameters; the latter are shared across all the tasks of the framework. Improved generalization and generalization error bounds can be achieved when compared to training the models separately. In the example of FIG. 1, input x is utilized by a plurality of specialized tasks f(1), f(2) through f(N), which process different target random variables. An intermediate-level representation f(shared) feeds the plurality of specialized tasks f(1), f(2) through f(N) from the input x. In the framework of FIG. 1, specialized task f(1) predicts y1 and specialized task f(N) predicts yN. The shared representation is not physically shared and, when handled by software in conventional technologies (such as CPU-based, GPU-based, and the like), can cause operational delays, excessive power consumption, and footprint penalties.

Figures 2A, 2B:
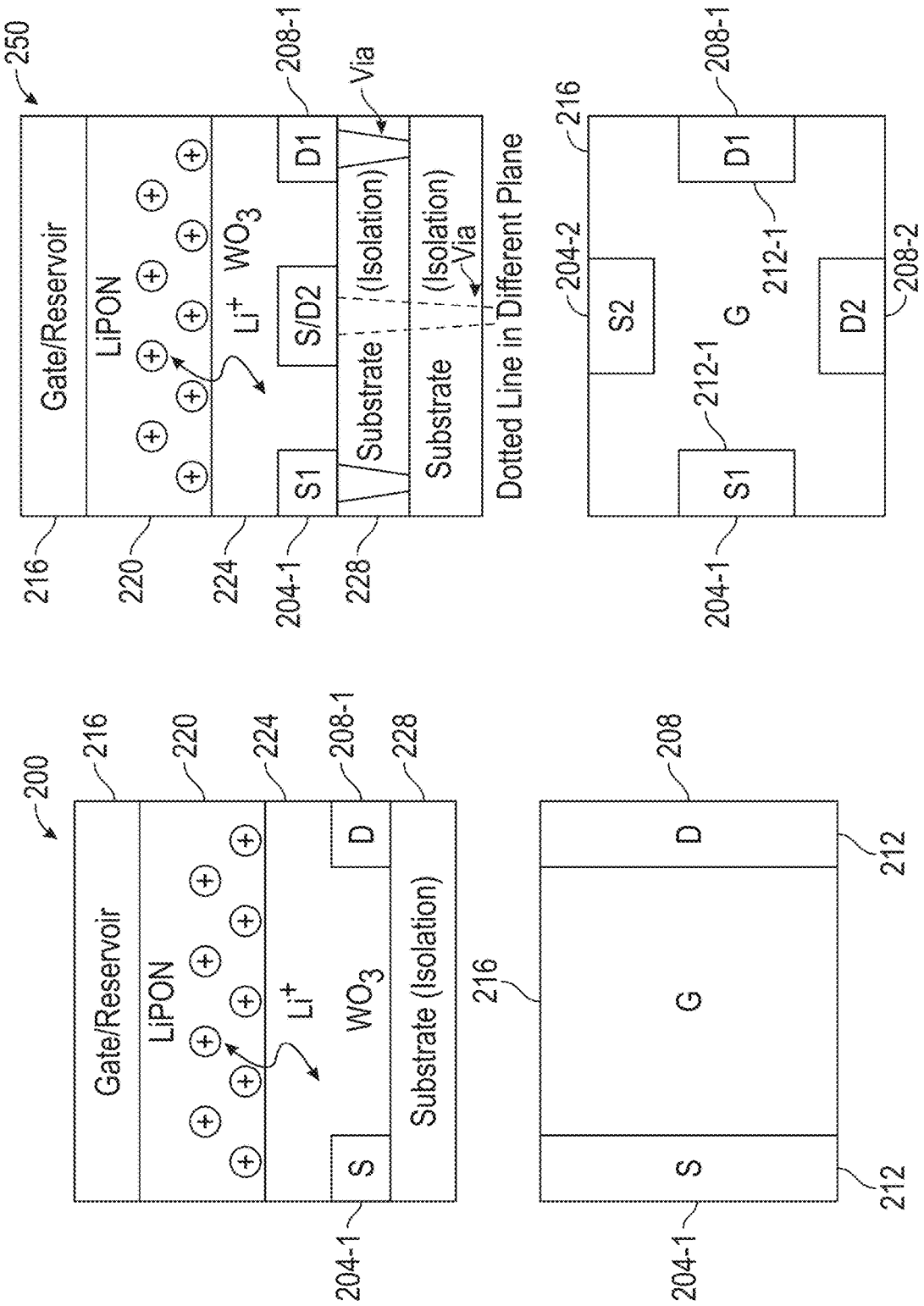
FIG. 2A illustrates a cross-sectional view and a top-down view of the structure of a conventional, nonvolatile ECRAM.
FIG. 2B illustrates a cross-sectional view and a top-down view of the structure of a novel, nonvolatile ECRAM, in accordance with an example embodiment.

FIG. 2A illustrates a cross-sectional view and a top-down view of the structure of a conventional, nonvolatile ECRAM 200. FIG. 2B illustrates a cross-sectional view and a top-down view of the structure of a novel, nonvolatile ECRAM 250, in accordance with an example embodiment. In one example embodiment, the ECRAM 200 and ECRAM 250 incorporate a gate (reservoir) 216, a transfer layer (e.g. lithium phosphorous oxy-nitride layer) 220, and a channel (e.g. an amorphous tungsten oxide $WO_3$ layer) 224 formed on a substrate 228. The lithium phosphorous oxy-nitride transfer layer 220 may be replaced, for example, with a hafnium oxide (HfO2) layer, a titanium pentoxide (Ta2O5) layer, and the like. The amorphous tungsten oxide $WO_3$ channel 224 may be replaced, for example, with a hafnium oxide (HfO2) layer, a titanium dioxide (TiO2) layer, and the like. In one example embodiment, weights stored in an ECRAM cell are shared (distributed) via multiple source-drain pairs 212 of sources 204-1, 204-2 (collectively referred to as sources 204 herein) and drains 208-1, 208-2 (collectively referred to as drains 208 herein) to enable sensing through different paths, as illustrated in FIG. 2B. In one example embodiment, all source-drain pairs 212 have identical separation lengths within the gate pattern. The source-drain pairs 212 are connected to deep neural networks (DNNs) at different levels to perform training for separate tasks. The weights are physically shared and there is no time delay for sharing them across different tasks (via the different source-drain pairs 212). In one example embodiment, contact vias to the source-drain pairs 212 are fabricated prior to the deposition of the channel 224 and located underneath the source-drain pairs 212. This eliminates the need for making contacts through the ECRAM stack and simplifies the device integration.

Note that various elements are numbered herein with reference characters having suffixes -1, -2, etc.; in general, the number of such elements depicted is exemplary and other embodiments can have different numbers of such elements.

Figure 3A:
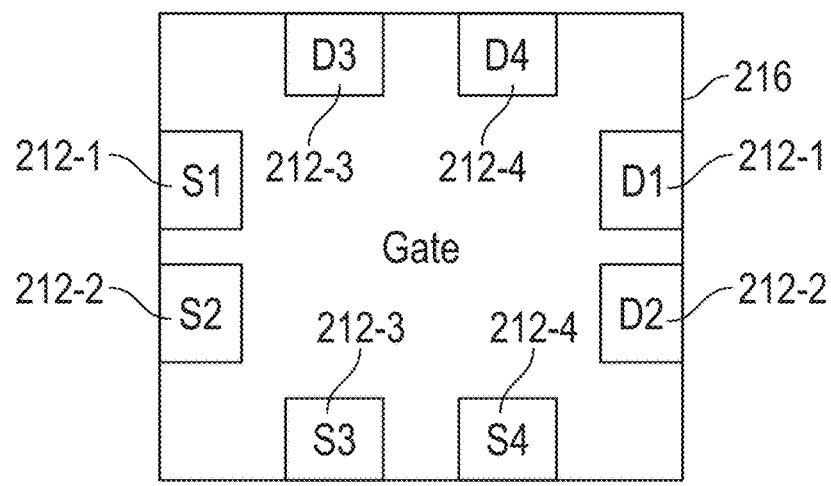
FIGS. 3A, 3B, and 3C illustrate a top-down view of the structure of different embodiments of the source-drain pairs, in accordance with an example embodiment.
Figure 3B:
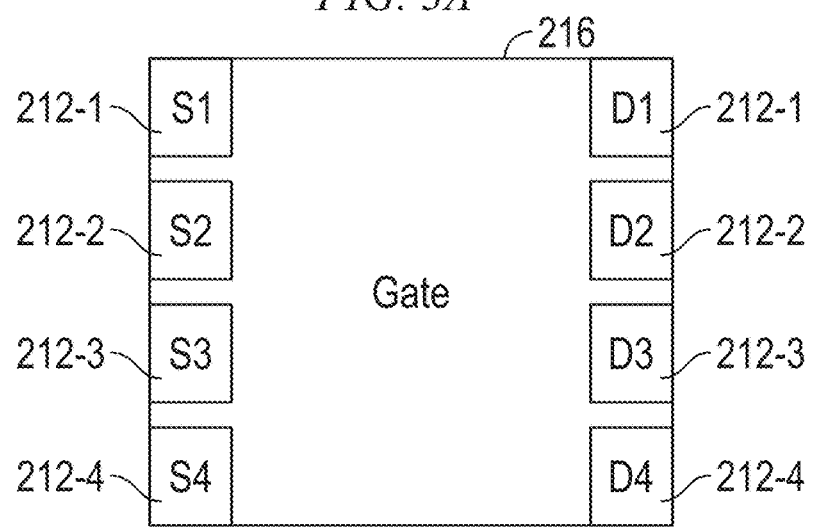
Figure 3C:
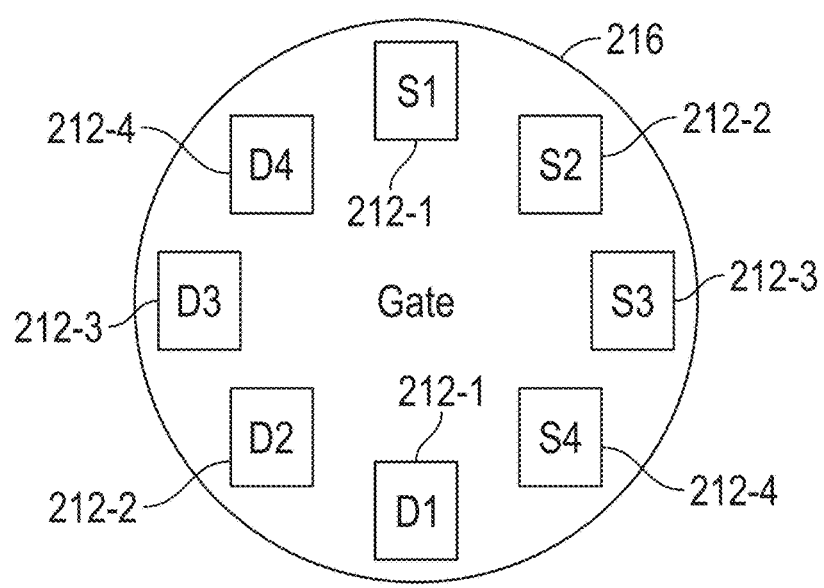

FIGS. 3A-3C illustrate top-down views of the structure of different non-limiting exemplary embodiments of the source-drain pairs 212, in accordance with aspects of the invention. The embodiment of FIG. 3A features a square gate 216 and parallel and perpendicular source-drain pairs 212 (specifically, 212-1, 212-2, 212-3, and 212-4) (in two directions). The embodiment of FIG. 3B features a square gate 216 and parallel source-drain pairs 212 (specifically, 212-1, 212-2, 212-3, and 212-4) (in one direction). The embodiment of FIG. 3C features a circular gate 216 where the source-drain pairs 212 (specifically, 212-1, 212-2, 212-3, and 212-4) are placed at polygonal corners of a polygon within the circular gate 216. For sensing on the ECRAM 250, the timing is delayed from programming to mitigate transient effects. The delay time is varied for each source-drain pair 212 to avoid interference with other paths.

Figure 4:
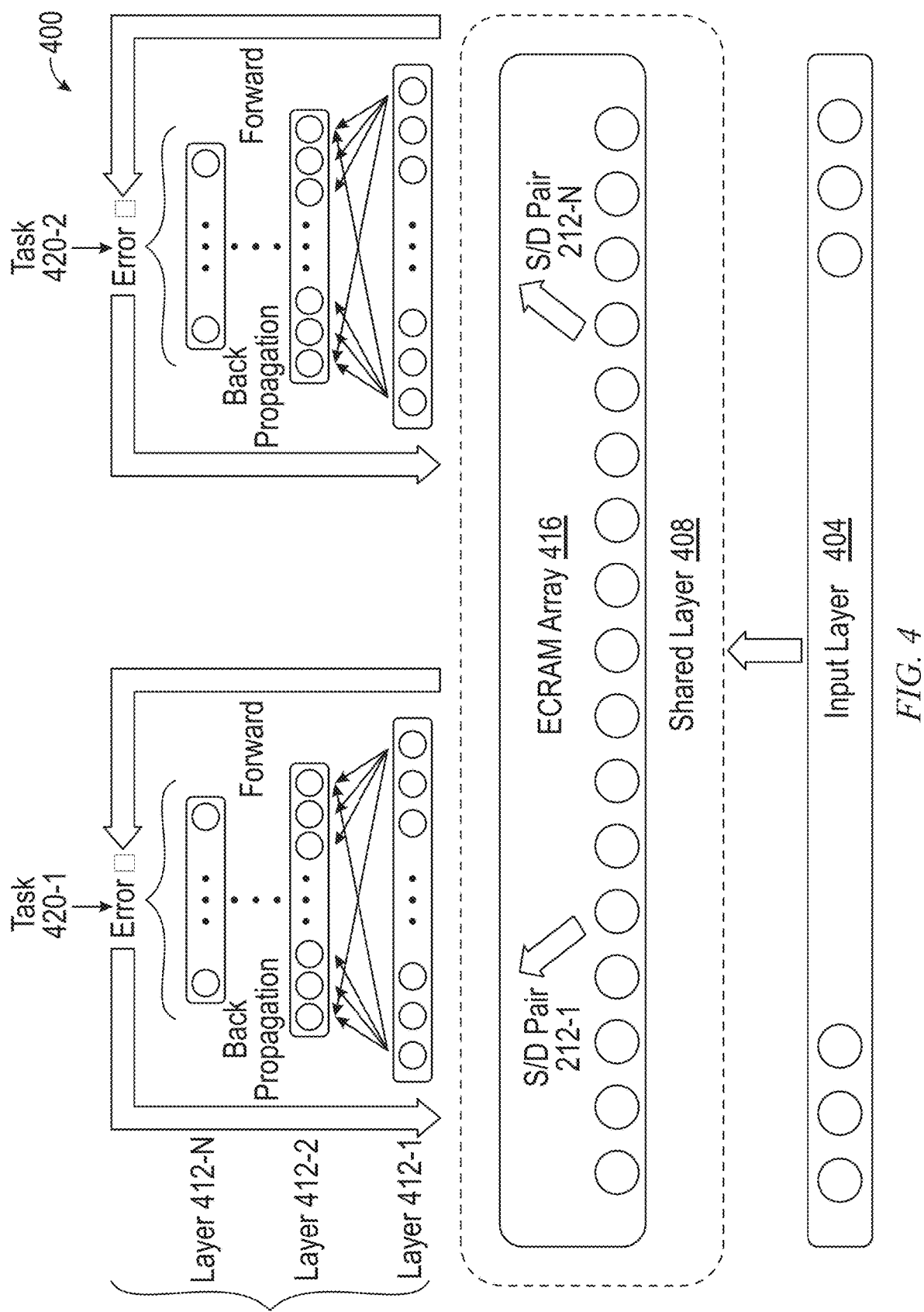
FIG. 4 is a block diagram of an example system for multi-task learning with hardware acceleration using an ECRAM array, in accordance with an example embodiment.

FIG. 4 is a block diagram of an example system 400 for multi-task learning with hardware acceleration using an ECRAM array 416, in accordance with an example embodiment. The system 400 provides physical connections between the pre-trained forward path of the neural network and the multiple independent DNNs that are dedicated to individual tasks 420-1, 420-2 (collectively referred to as tasks 420 herein) of the multi-task learning system 400. Data is received by a pre-trained shared layer 408 via an input layer 404. The pre-trained shared layer 408 comprises the ECRAM array 416 constructed from a plurality of ECRAMs 250 and programmable via gates 216. Physical connections to layers 412-1, 412-2 ... 412-N (collectively referred to as layers 412 herein) are accomplished via the source-drain pairs 212-1 ... 212-N of the ECRAM array 416 within the shared layer 408 (as depicted, for example, in FIGS. 3A-3C). Thus, the shared layer 408 enables input data to be distributed to a plurality of tasks 420 in the multi-task learning system 400. The layers 412 incorporate NVM crossbar arrays for, e.g., online training and support of the plurality of tasks 420. Layer 412-N serves as the output layer. The input layer 404 and layers 412 may comprise an ECRAM array 416 or other types of arrays including, but not limited to, a resistive random access memory (ReRAM or RRAM) array, a phase change memory (PCM) array, and the like.

Figure 5A:
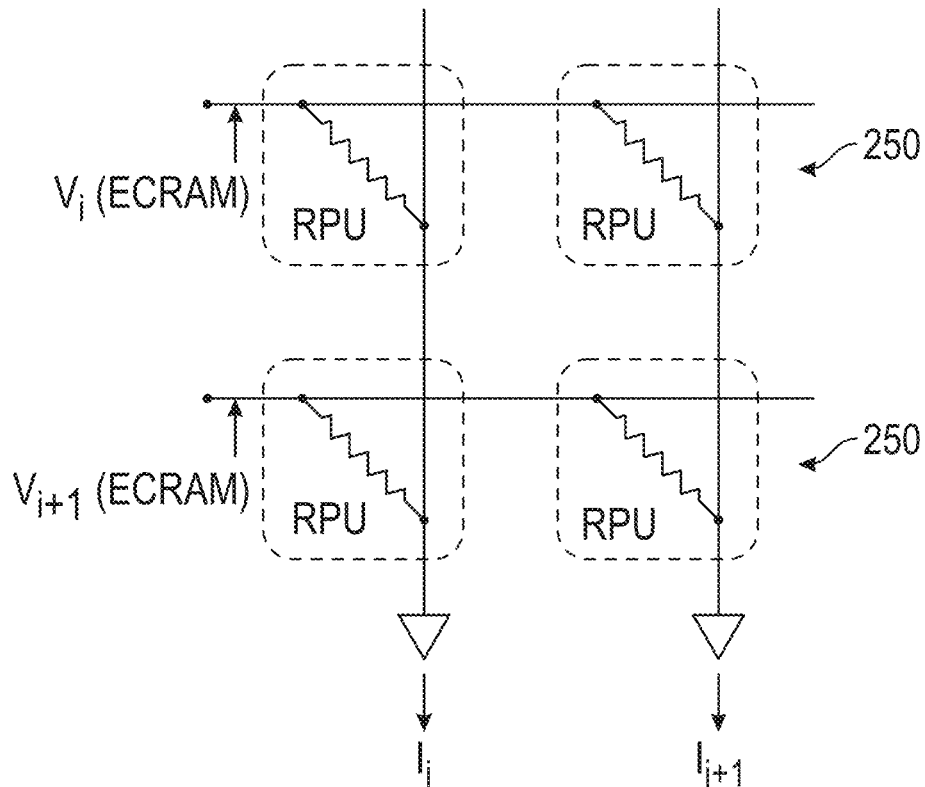
FIGS. 5A, 5B, and 5C are schematic diagrams of example connections for a task, in accordance with an example embodiment.
Figure 5B:
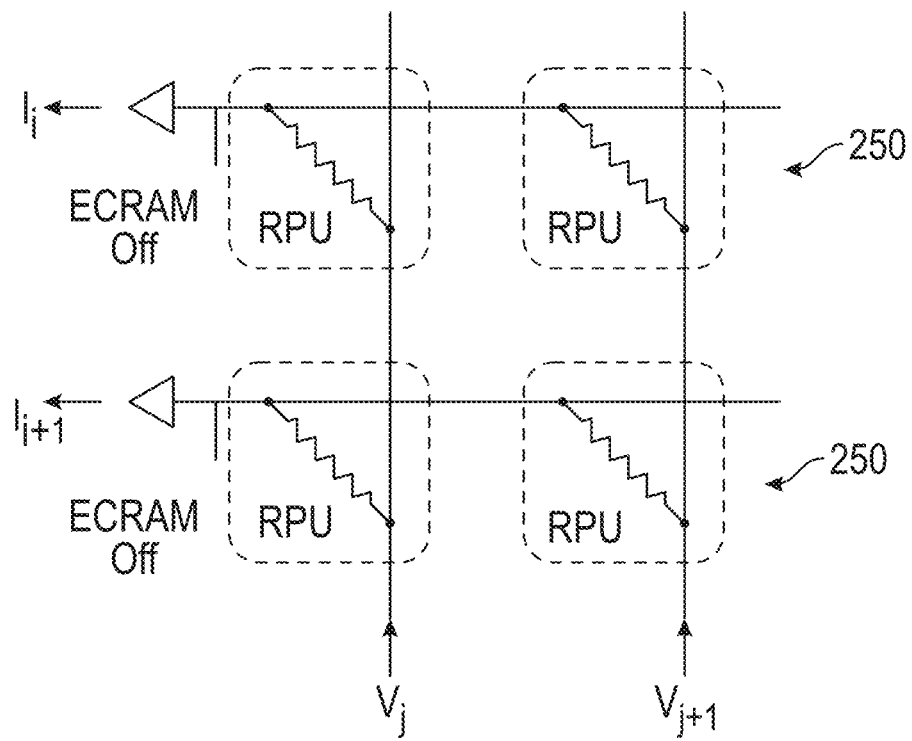
Figure 5C:
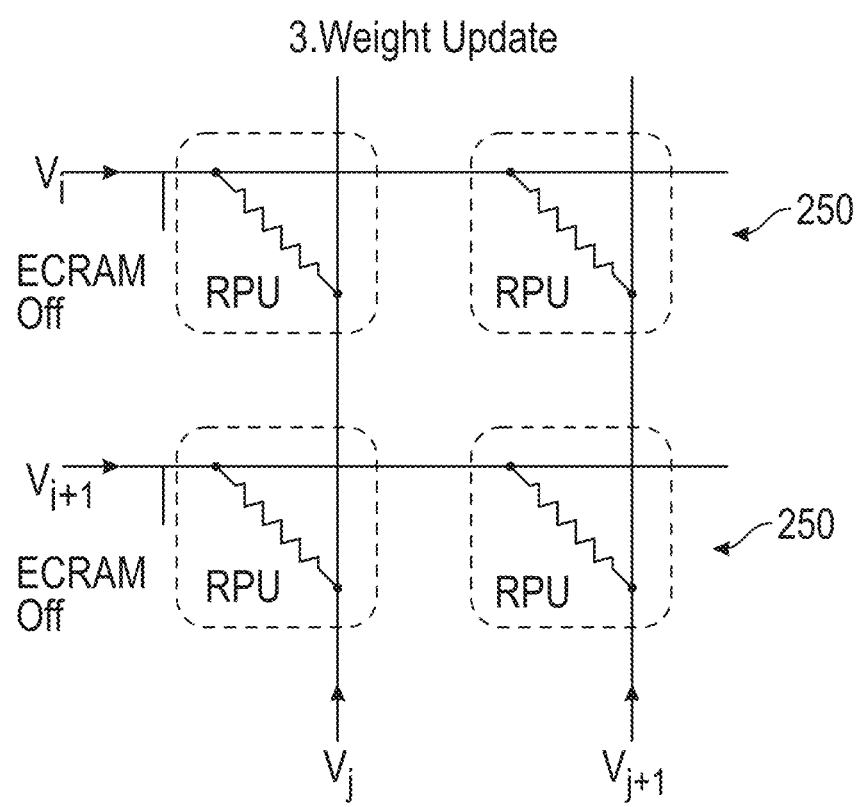

FIGS. 5A-5C are schematic diagrams of example connections for a task 420, in accordance with an example embodiment. In one example embodiment, ECRAM array 416 is used only for the forward pass from the input layer 404 to the layers 412, as illustrated in FIG. 5A. Error back-propagation is performed through a separate backward pass for each task 420, during which the ECRAM array 416 is turned off by applying no bias to the ECRAMs 250, as illustrated in FIG. 5B. FIG. 5C shows a weight update process. During a weight update process, the ECRAM array 416 is turned off to avoid changing the shared weights, and electrical bias is supplied via a separate path to change the weights of the memory array for layers 412.

Figure 6A:
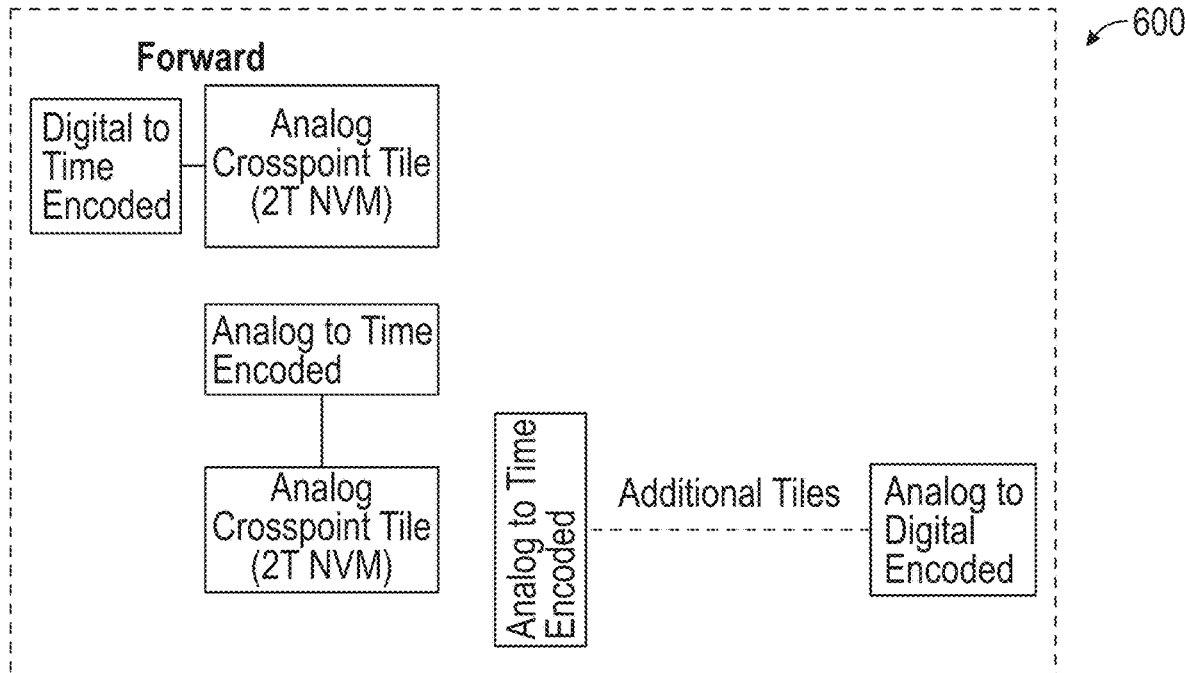
FIG. 6A is a block diagram for a conventional analog architecture with time-encoded communication.
Figure 6B:
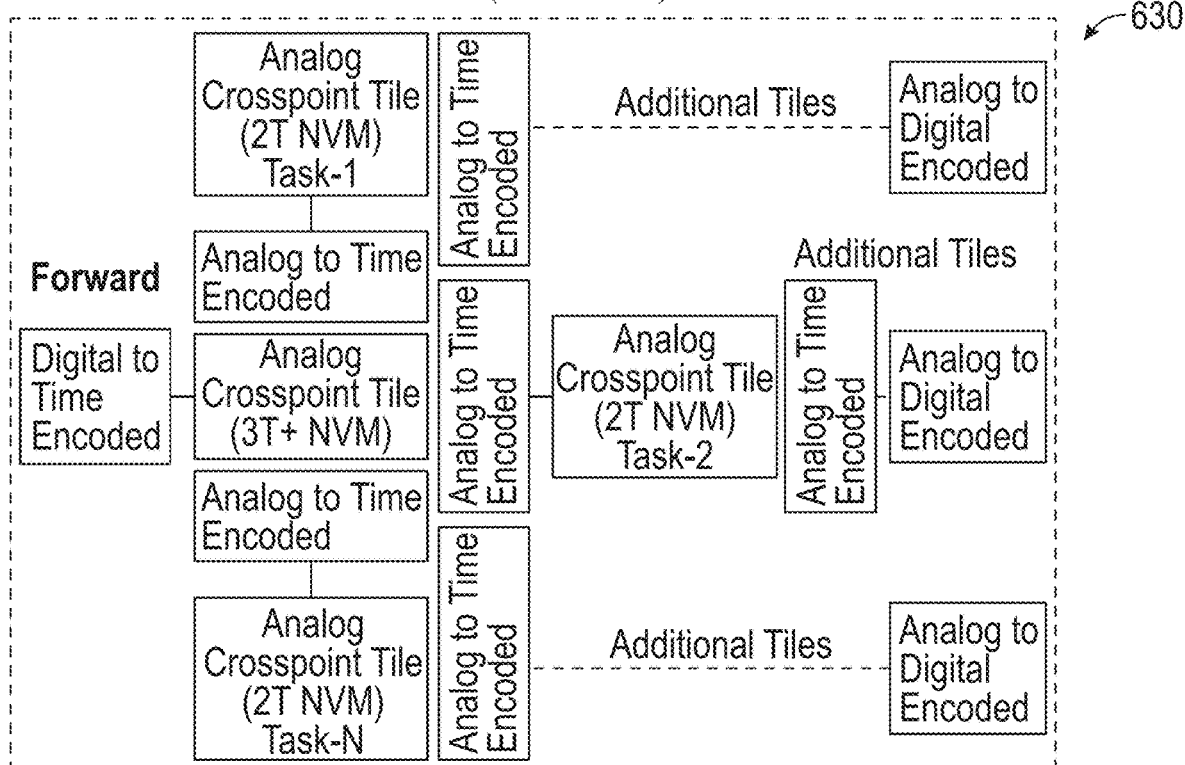
FIG. 6B is a block diagram for a novel analog architecture with time-encoded communication, in accordance with an example embodiment.
Figure 6C:
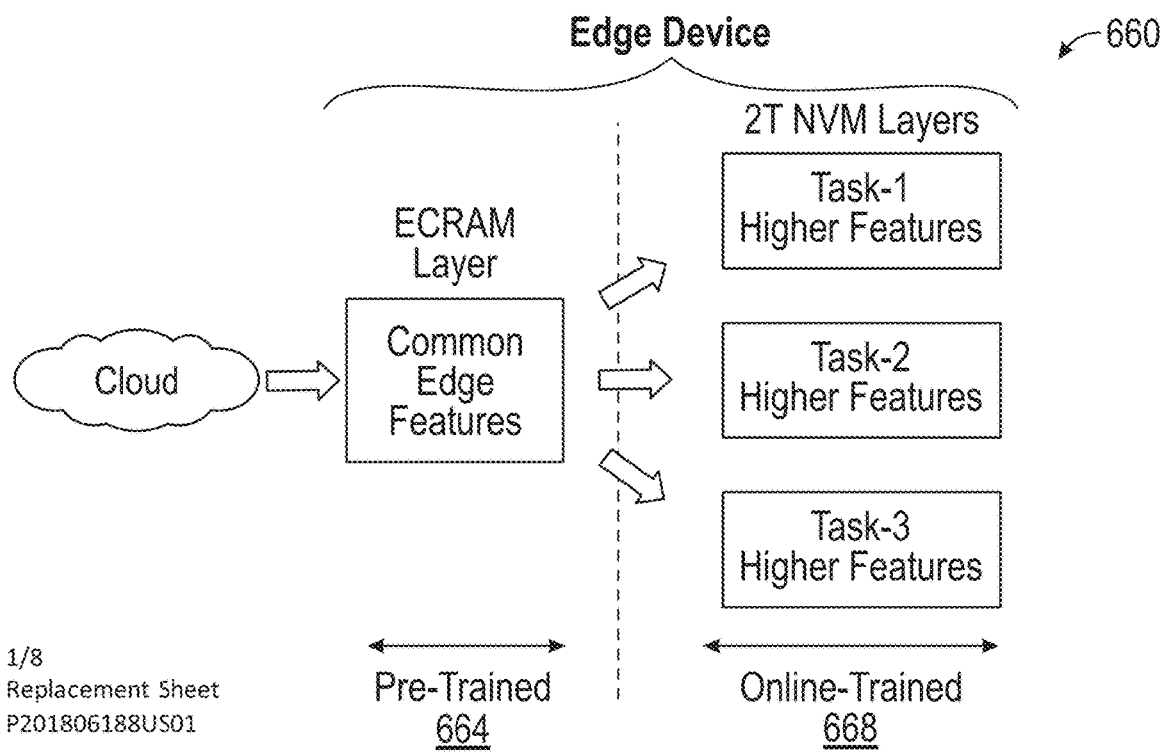
FIG. 6C is a block diagram for an example partition of a multi-task learning system, in accordance with an example embodiment.

FIG. 6A is a block diagram for a conventional analog architecture 600 with time-encoded communication. Conversion of digital inputs to time encoded signals is performed first and all subsequent neural network layers are processed with analog time encoded signals. Finally, the output of the neural network is converted from analog to digital signals. FIG. 6B is a block diagram for a novel analog architecture 630 with time-encoded communication, in accordance with an example embodiment. In this architecture, the conversion of digital inputs to time encoded signals is performed first, similar to a conventional architecture, but they are passed to the ECRAM array for multi-task learning. The ECRAM array stores shared weights for multi-task learning and fans out analog signals to multiple paths via different pairs of source-drain pairs 212. In one example embodiment, all subsequent neural network layers are processed with analog time encoded signals using conventional two-terminal NVM arrays for each task. FIG. 6C is a block diagram for an example partition of a multi-task learning system 660, in accordance with an example embodiment. The multi-task learning system 660 includes a pre-trained section 664 (incorporating shared layer 408) and training section 668 (incorporating layers 412). In one example embodiment, pre-trained weights of the neural network of the shared layer 408 are used for detection of lower-level edge features (such as histogram of oriented gradient (HOG) techniques, Gabor filters, and the like). The lower-level edge features are utilized by a plurality of individual tasks 420 to extract higher-level features using the neural networks of the layers 412. The individual tasks 420 are trained online using back-propagation, as illustrated in FIG. 4.

Figure 6D:
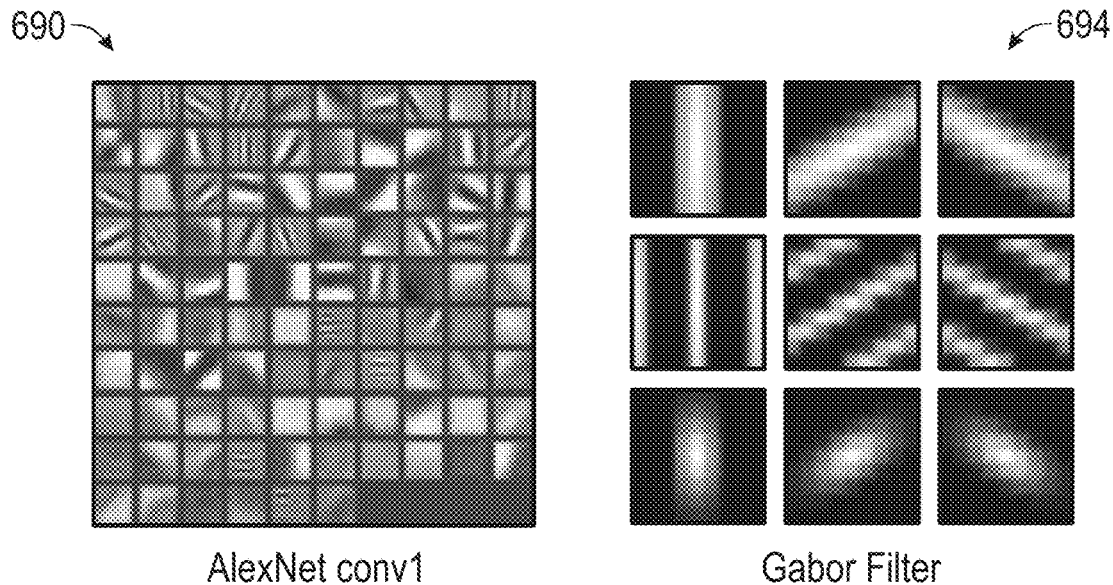
FIG. 6D illustrates the results of implementing different image filters as individual tasks, in accordance with an example embodiment.

In this approach, all crossbar array layers (such as layers 412) in the structure include NVM devices (such as 3T+ ECRAM and conventional 2T NVM). This reduces power consumption and enables implementation on edge devices. Structured layers, such as the pre-trained shared layer 408 and the training layers 412 reduce the total training time and enable online training at edge devices. Physically shared common weights reduce the memory footprint for multi-task learning and help increase throughput and decrease latency for inference. FIG. 6D illustrates the results of implementing different image filters as individual tasks 420. The tasks 420 share a common input via the input layer 404 and the shared layer 408.

Given the discussion thus far, it will be appreciated that, in general terms, an exemplary electro-chemical random-access memory (ECRAM) cell 250, according to an aspect of the invention, includes a substrate 228; a plurality of source-drain pairs 212 positioned on a top surface of the substrate 228, each source-drain pair 212 comprising a source 204 and a drain 208; a channel 224 at least partially overlaying the substrate 228 and the plurality of source-drain pairs 212; a transfer layer 220 at least partially overlaying the channel 224; and a gate 216 at least partially overlaying the transfer layer 220, the gate 216 at least partially controlling a channel between each source-drain pair 212.

In one example embodiment, each source-drain pair 212 is configured to enable sensing of data stored in the ECRAM cell 250 via a different electrical path. In one example embodiment, all source-drain pairs 212 have substantially identical separation lengths within a gate pattern. In one example embodiment, data stored in the ECRAM cell 250 is a weight of a neural network. In one example embodiment, the gate 216 is a square gate and the source-drain pairs 212 have a parallel layout. In one example embodiment, the gate 216 is a square gate and each source-drain pair 212 is parallel to at least one other source-drain pair 212 and perpendicular to at least one other source-drain pair 212.

In one example embodiment, the gate 216 is a circular gate and each source-drain pair 212 is placed at a polygonal corner of a polygon within the circular gate. In one example embodiment, timing is delayed from programming to mitigate a transient effect. In one example embodiment, a delay time is varied for each source-drain pair 212 to avoid interference with other paths through the source-drain pairs 212.

In one example embodiment, a multi-task learning system 400 comprises an input layer 404; a pre-trained shared layer 408 coupled to the input layer 404; and one or more processing layers 412 coupled to the pre-trained shared layer 408; wherein the pre-trained shared layer 408 comprises an array 416 of ECRAMs 250, each ECRAM 250 comprises a gate 216; and a plurality of source-drain pairs 212, each source drain-pair 212 comprising a source 204 and a drain 208 and providing a connection to a task 420 of one of the one or more processing layers 412, the gate 216 at least partially controlling a channel between each source-drain pair 212. In one example embodiment the input layer 404 comprises a second ECRAM array 416. In one example embodiment, at least one of the processing layers 412 comprises an ECRAM array 416. In one example embodiment, the ECRAM array 416 of the pre-trained shared layer 408 is used only for a forward pass from the input layer 404 to at least one of the processing layers 412.

In one example embodiment, the multi-task learning system 400 is configured to apply no bias during error back-propagation to disable the ECRAM 250. In one example embodiment, at least one of the one or more processing layers 412 incorporates a non-volatile memory (NVM) crossbar array for online training and support of a plurality of tasks 420. In one example embodiment, at least one of the one or more processing layers 412 serves as an output layer. In one example embodiment, pre-trained weights of the pre-trained shared layer 408 are used for detection of edge features and higher-level features are extracted via individual tasks 420 using the one or more processing layers 412, and wherein the individual tasks 420 are trained online with back-propagation.

In one or more embodiments, a further step includes fabricating a physical integrated circuit in accordance with the analyzed design. One non-limiting specific example of accomplishing this is described elsewhere herein in connection with FIGS. 7-9. For example, a design structure, based on the analyzed design, is provided to fabrication equipment to facilitate fabrication of a physical integrated circuit in accordance with the design structure.

In one or more embodiments, a layout is prepared based on the analysis.

In one or more embodiments, the layout is instantiated as a design structure.

In one or more embodiments, a physical integrated circuit is fabricated in accordance with the design structure.

As noted, in one or more embodiments, the layout is instantiated as a design structure. See discussion of FIG. 7. A physical integrated circuit is then fabricated in accordance with the design structure. See again discussion of FIG. 7. Refer also to FIG. 8. Once the physical design data is obtained, an integrated circuit designed in accordance therewith can be fabricated according to known processes that are generally described with reference to FIG. 8. Generally, a wafer with multiple copies of the final design is fabricated and cut (i.e., diced) such that each die is one copy of the integrated circuit. At block 810, the processes include fabricating masks for lithography based on the finalized physical layout. At block 820, fabricating the wafer includes using the masks to perform photolithography and etching. Once the wafer is diced, testing and sorting each die is performed at 830 to filter out any faulty die.

Figure 10:
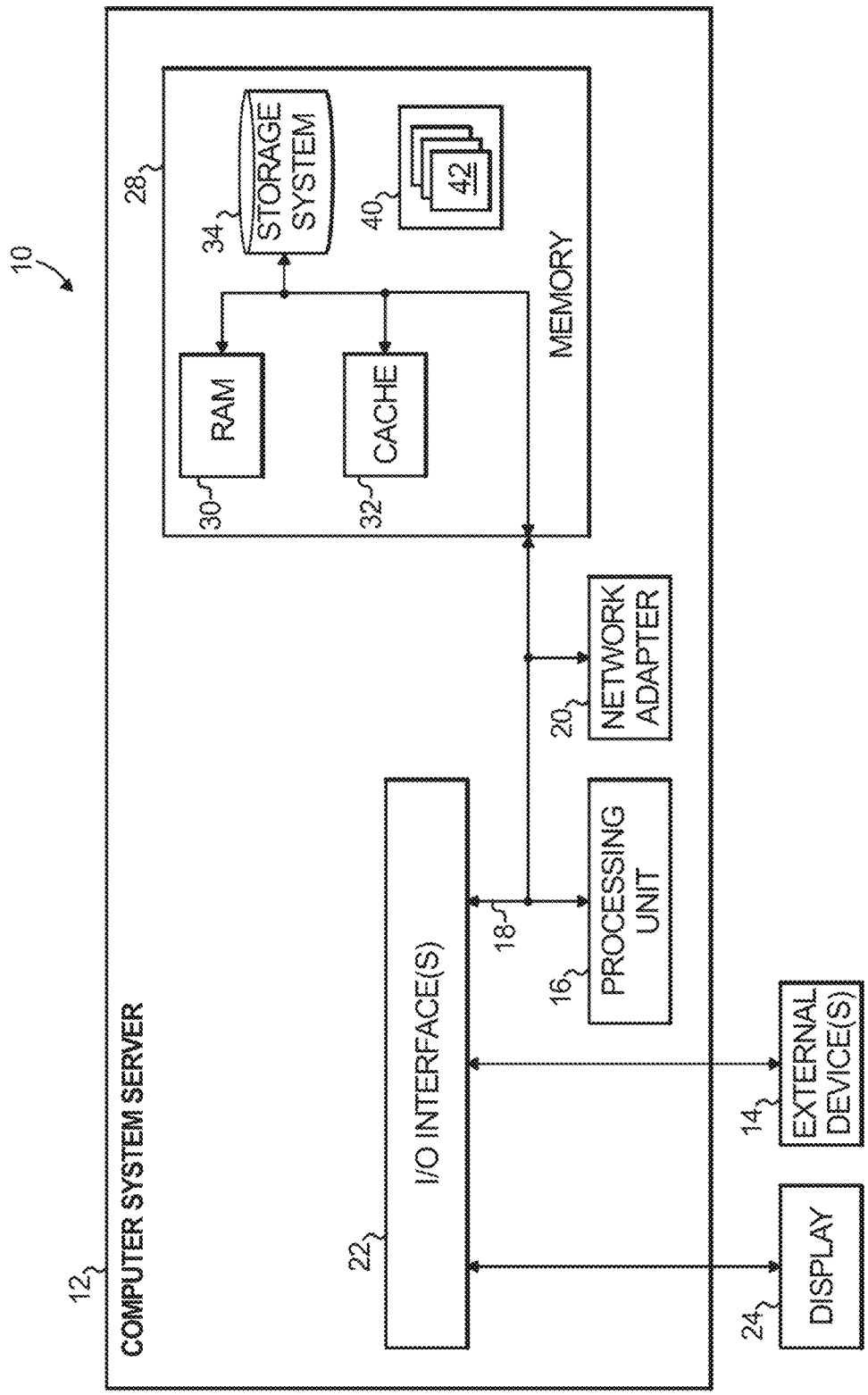
FIG. 10 depicts a computer system that may be useful in implementing one or more aspects and/or elements of the invention.

One or more embodiments include a computer including a memory 28; at least one processor 16, coupled to the memory, and operative to carry out or otherwise facilitate any one, some, or all of the method steps described herein (as depicted in FIG. 10).

Figure 7:
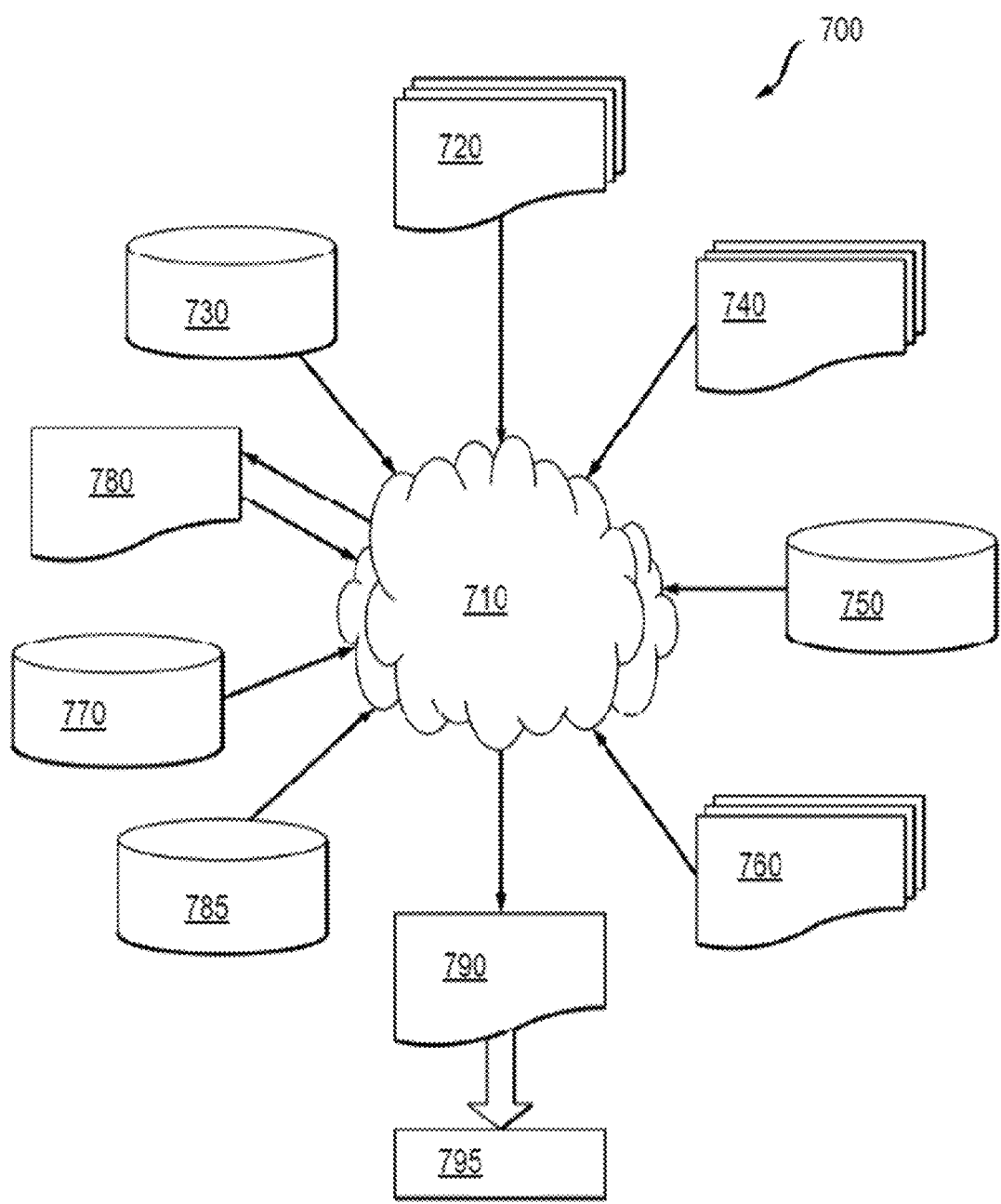
FIG. 7 is a flow diagram of a design process used in semiconductor design, manufacture, and/or test.
Figure 8:
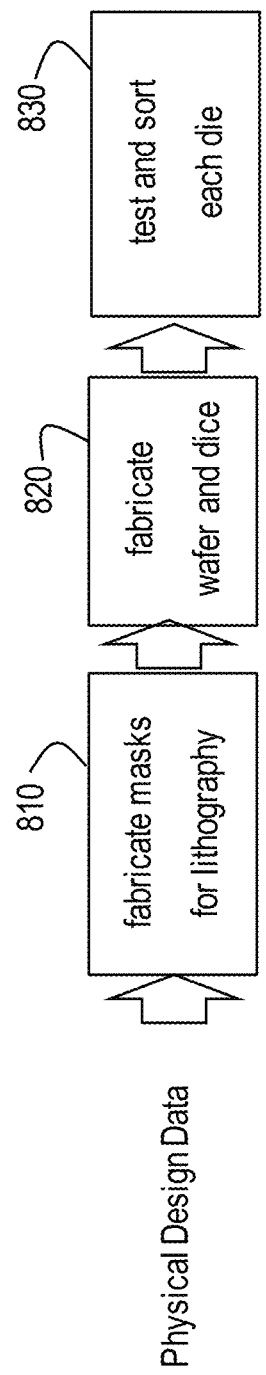
FIG. 8 shows further aspects of IC fabrication from physical design data.

Furthermore, referring to FIG. 7, in one or more embodiments the at least one processor is operative to generate a design structure for the integrated circuit design in accordance with the analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of the ECRAM cell 250 featuring a gate and multiple source-drain pairs to facilitate the distribution of data) compared to prior art architectures which utilize conventional CPU and Memory for distribution of shared weights.

Figure 9:
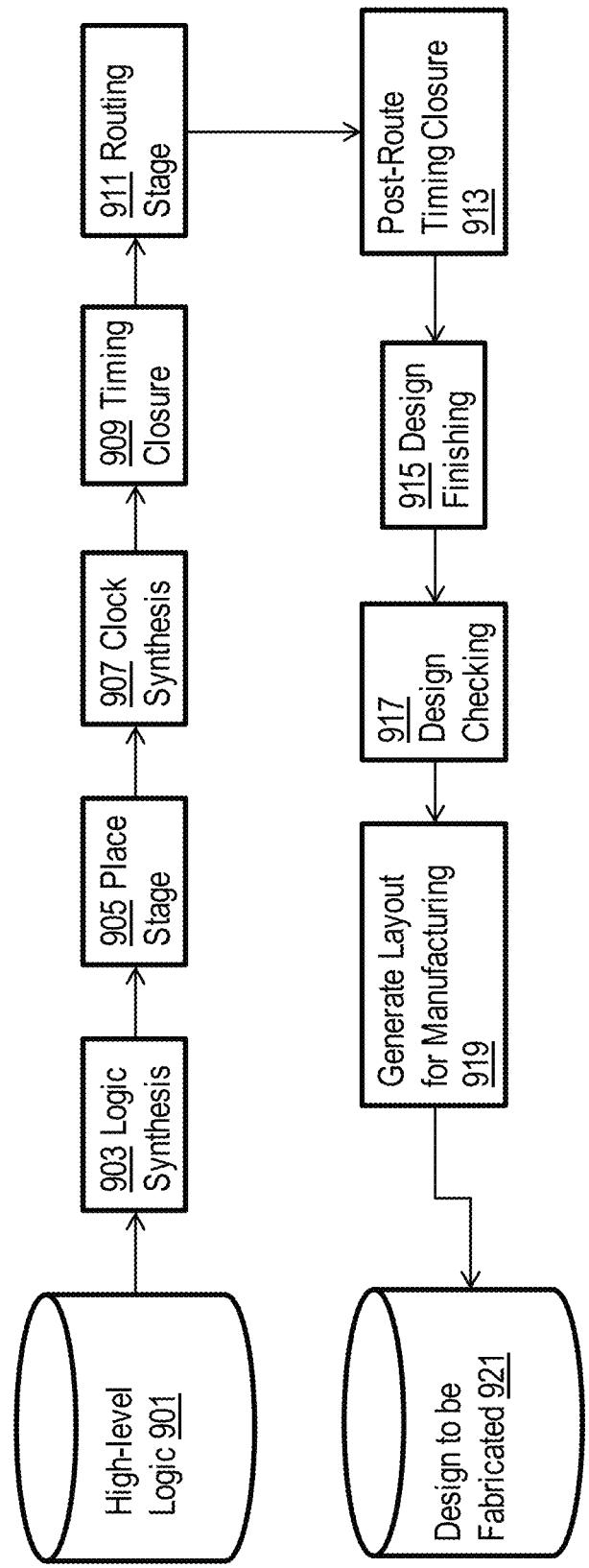
FIG. 9 shows an exemplary high-level Electronic Design Automation (EDA) tool flow, within which aspects of the invention can be employed.

FIG. 9 depicts an example high-level Electronic Design Automation (EDA) tool flow, which is responsible for creating an optimized microprocessor (or other IC) design to be manufactured. A designer could start with a high-level logic description 901 of the circuit (e.g. VHDL or Verilog). The logic synthesis tool 903 compiles the logic, and optimizes it without any sense of its physical representation, and with estimated timing information. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, electromigration (e.g., using techniques disclosed herein) or noise. When the design is clean, the final step 919 is to generate a layout for the design, representing all the shapes to be fabricated in the design to be fabricated 921.

One or more embodiments of the invention, or elements thereof, can be implemented in the form of an apparatus including a memory and at least one processor that is coupled to the memory and operative to perform exemplary method steps. FIG. 10 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 10, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 10) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electro-chemical random-access memory (ECRAM) cell comprising:
   a substrate having a top surface;
   a plurality of source-drain pairs positioned on the top surface of the substrate, each of the source-drain pairs comprising a source and a drain;
   a channel at least partially overlaying the substrate and the plurality of source-drain pairs;
   a transfer layer at least partially overlaying the channel; and
   a gate at least partially overlaying the transfer layer, the gate at least partially controlling a channel between each source-drain pair.

2. The ECRAM cell of claim 1, wherein each source-drain pair is configured to enable sensing of data stored in the ECRAM cell via a different electrical path.

3. The ECRAM cell of claim 1, wherein all source-drain pairs have substantially identical separation lengths within a gate pattern.

4. The ECRAM cell of claim 1, wherein data stored in the ECRAM cell is a weight of a neural network.

5. The ECRAM cell of claim 1, wherein the gate is a square gate and the source-drain pairs have a parallel layout.

6. The ECRAM cell of claim 1, wherein the gate is a square gate and each source-drain pair is parallel to at least one other source-drain pair and perpendicular to at least one other source-drain pair.

7. The ECRAM cell of claim 1, wherein the gate is a circular gate and each source-drain pair is placed at a polygonal corner of a polygon within the circular gate.

8. The ECRAM cell of claim 1, wherein timing is delayed from programming to mitigate a transient effect.

9. The ECRAM cell of claim 8, wherein a delay time is varied for each source-drain pair to avoid interference with other paths through the source-drain pairs.

10. A multi-task learning system comprising:
    an input layer;
    a pre-trained shared layer coupled to the input layer; and
    one or more processing layers coupled to the pre-trained shared layer;
    wherein the pre-trained shared layer comprises an array of ECRAMs, each ECRAM comprising;
    a gate; and
    a plurality of source-drain pairs, each source drain-pair comprising a source and a drain and providing a connection to a task of one of the one or more processing layers, the gate at least partially controlling a channel between each source-drain pair.

11. The multi-task learning system of claim 10, wherein the input layer comprises a second ECRAM array.

12. The multi-task learning system of claim 10, wherein at least one of the processing layers comprises an ECRAM array.

13. The multi-task learning system of claim 10, wherein the ECRAM array of the pre-trained shared layer is used only for a forward pass from the input layer to at least one of the processing layers.

14. The multi-task learning system of claim 10, the multi-task learning system being further configured to apply no bias during error back-propagation to disable the ECRAM.

15. The multi-task learning system of claim 10, wherein at least one of the one or more processing layers incorporates a non-volatile memory (NVM) crossbar array for online training and support of a plurality of tasks.

16. The multi-task learning system of claim 10, wherein at least one of the one or more processing layers serves as an output layer.

17. The multi-task learning system of claim 10, wherein pre-trained weights of the pre-trained shared layer are used for detection of edge features and higher-level features are extracted via individual tasks using the one or more processing layers, and wherein the individual tasks are trained online with back-propagation.

18. The multi-task learning system of claim 10, each ECRAM further comprising:
    a substrate, the plurality of source-drain pairs are positioned on a top surface of the substrate;
    a channel at least partially overlaying the substrate and the plurality of source-drain pairs; and
    a transfer layer at least partially overlaying the channel, the gate at least partially overlaying the transfer layer.

19. The multi-task learning system of claim 10, wherein each source-drain pair is configured to enable sensing of data stored in the ECRAM cell via a different electrical path and wherein all source-drain pairs have substantially identical separation lengths within a gate pattern.

20. The multi-task learning system of claim 10, wherein timing is delayed from programming to mitigate a transient effect and wherein a delay time is varied for each source-drain pair to avoid interference with other paths through the source-drain pairs.

* * * * *